(12) United States Patent
Kim et al.

(10) Patent No.: US 8,464,087 B2
(45) Date of Patent: *Jun. 11, 2013

(54) FLASH MEMORY DEVICES WITH HIGH DATA TRANSMISSION RATES AND MEMORY SYSTEMS INCLUDING SUCH FLASH MEMORY DEVICES

(75) Inventors: Yeon-Ho Kim, Seoul (KR); Kyeong-Han Lee, Gyeonggi-do (KR); Jong-Hwa Kim, Geonggi-do (KR); In-Young Kim, Seoul (KR); Young-Joon Choi, Gyeonggi-do (KR); Seok-Cheon Kwon, Gyeonggi-do (KR)

(73) Assignee: Samsung Electronics Co., Ltd., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 13/332,904

(22) Filed: Dec. 21, 2011

(65) Prior Publication Data

US 2012/0089770 A1    Apr. 12, 2012

Related U.S. Application Data

(63) Continuation of application No. 11/953,385, filed on Dec. 10, 2007, now Pat. No. 8,286,021.

(30) Foreign Application Priority Data

Dec. 12, 2006   (KR) .............................. 2006-126443

(51) Int. Cl.
*G06F 1/12*    (2006.01)
*G11C 11/34*   (2006.01)

(52) U.S. Cl.
USPC ...................................... 713/400; 365/185.33

(58) Field of Classification Search
USPC ...................................... 713/400; 365/185.33
See application file for complete search history.

(56) References Cited

U.S. PATENT DOCUMENTS

| | | | |
|---|---|---|---|
| 4,430,724 A * | 2/1984 | Hamilton et al. | 710/305 |
| 5,268,863 A * | 12/1993 | Bader et al. | 365/189.16 |
| 5,966,723 A | 10/1999 | James et al. | |
| 6,570,791 B2 | 5/2003 | Roohparvar et al. | |
| 6,594,167 B1 | 7/2003 | Yamasaki et al. | |
| 6,662,287 B1 | 12/2003 | Andreev et al. | |
| 6,724,682 B2 | 4/2004 | Lee et al. | |
| 7,061,804 B2 | 6/2006 | Chun et al. | |

(Continued)

FOREIGN PATENT DOCUMENTS

| | | |
|---|---|---|
| JP | 2005-182996 A | 7/2005 |
| JP | 2006-040518 A | 2/2006 |
| KR | 10-2005-0062744 A | 6/2005 |
| KR | 10-0546418 B1 | 1/2006 |

*Primary Examiner* — Kim Huynh
*Assistant Examiner* — Zahid Choudhury
(74) *Attorney, Agent, or Firm* — Muir Patent Consulting, PLLC

(57) ABSTRACT

A flash memory device includes a memory cell array, a clock signal input, an input for receiving a signal designating a writing operating mode, a plurality of data input/output pads, and a data input/output buffer circuit that is electrically connected to the clock signal input and to the plurality of data input/output pads. The data input/output buffer circuit is configured to receive data that is to be written to the memory cell array through the data input/output pads in synchronization with a clock signal that is applied to the clock signal input in response to activation of the signal designating the writing operating mode.

43 Claims, 12 Drawing Sheets

U.S. PATENT DOCUMENTS

| | | |
|---|---|---|
| 7,116,603 B2 | 10/2006 | Kanda et al. |
| 7,181,563 B2 | 2/2007 | Andreev et al. |
| 7,478,213 B2 | 1/2009 | Adusumilli |
| 7,486,571 B2 | 2/2009 | Kitagawa |
| 7,558,900 B2 | 7/2009 | Jigour et al. |
| 7,606,992 B1 | 10/2009 | Karabatsos |
| RE41,879 E | 10/2010 | Iwanari et al. |
| 2001/0024384 A1 | 9/2001 | Arimoto et al. |
| 2002/0024330 A1* | 2/2002 | Hosogane et al. ............ 323/317 |
| 2002/0057590 A1 | 5/2002 | Kang et al. |
| 2002/0110023 A1 | 8/2002 | Yoshida |
| 2002/0176297 A1 | 11/2002 | Makabe et al. |
| 2004/0049637 A1 | 3/2004 | Morikawa |
| 2005/0018514 A1 | 1/2005 | Knaack et al. |
| 2005/0041450 A1 | 2/2005 | Duh et al. |
| 2005/0135145 A1* | 6/2005 | Lee et al. ...................... 365/154 |
| 2006/0023499 A1 | 2/2006 | Ryu |
| 2006/0095650 A1 | 5/2006 | Perroni et al. |
| 2006/0203576 A1 | 9/2006 | Nishimura et al. |
| 2006/0250884 A1* | 11/2006 | Shimbayashi ................ 365/233 |
| 2007/0008781 A1 | 1/2007 | Jono et al. |
| 2007/0124558 A1 | 5/2007 | Lee et al. |
| 2008/0028165 A1 | 1/2008 | Sukegawa et al. |
| 2008/0151622 A1 | 6/2008 | Qawami et al. |
| 2008/0266924 A1 | 10/2008 | Abedifard |

* cited by examiner

Fig. 1

(PRIOR ART)

| | | | | |
|---|---|---|---|---|
| N.C | 1 | | 48 | N.C |
| N.C | 2 | | 47 | N.C |
| N.C | 3 | | 46 | N.C |
| N.C | 4 | | 45 | N.C |
| N.C | 5 | | 44 | I/O7 |
| N.C | 6 | | 43 | I/O6 |
| R/$\overline{B}$ | 7 | | 42 | I/O5 |
| $\overline{RE}$ | 8 | | 41 | I/O4 |
| $\overline{CE}$ | 9 | | 40 | N.C |
| N.C | 10 | | 39 | N.C |
| N.C | 11 | 48-pin TSOP1 | 38 | N.C |
| Vcc | 12 | Standard Type | 37 | Vcc |
| Vss | 13 | 12mm X 20mm | 36 | Vss |
| N.C | 14 | | 35 | N.C |
| N.C | 15 | | 34 | N.C |
| CLE | 16 | | 33 | N.C |
| ALE | 17 | | 32 | I/O3 |
| $\overline{WE}$ | 18 | | 31 | I/O2 |
| $\overline{WP}$ | 19 | | 30 | I/O1 |
| N.C | 20 | | 29 | I/O0 |
| N.C | 21 | | 28 | N.C |
| N.C | 22 | | 27 | N.C |
| N.C | 23 | | 26 | N.C |
| N.C | 24 | | 25 | N.C |

FLASH MEMORY DEVICES WITH HIGH DATA TRANSMISSION RATES AND MEMORY SYSTEMS INCLUDING SUCH FLASH MEMORY DEVICES

CROSS-REFERENCE TO RELATED APPLICATION

This application is a Continuation from U.S. non-provisional patent application Ser. No. 11/953,385, filed on Dec. 10, 2007 now U.S. Pat. No. 8,286,021 which claims priority under 35 U.S.C. §119 from Korean Patent Application No. 2006-126443, filed on Dec. 12, 2006, the entirety of each of which is incorporated herein by reference as if set forth in its entirety.

FIELD OF THE INVENTION

The present invention relates to semiconductor memory devices and, more particularly, to flash memory devices and memory systems that include flash memory devices.

BACKGROUND

FIG. 1 is a diagram illustrating the pin configuration of a standard 48-pin TSOP1 circuit that may be used in a general NAND flash memory device. As shown in FIG. 1, the standard 48-pin TSOP1 includes a plurality of control pins such as /WE, ALE, CLE, /CE, /RE, and R/BB, power pins Vcc and Vss, and input/output pins I/O0~I/O7. As is well known, data that is to he programmed into the flash memory device is input through the input/output pins I/O0~I/O7 in synchronization with a transition (e.g. a rising edge or a falling edge) of a control signal /WE. Data that is to be read from the flash memory device is output through the input/output pins I/O0~I/O7 in synchronization with a transition of the control signal /RE.

The quantity of data that is input into or output from a NAND flash memory device may increase in proportion to the capacity of the NAND flash memory device. Accordingly, as the capacity of NAND flash memory devices increases, all else being equal, the time required to transfer data between the NAND flash memory device and a flash controller may increase. For example, the time required to transfer data between a flash controller and a NAND flash memory device having a 1 kilobyte page size will be twice the time required to transfer data between a flash controller and a NAND flash memory device having a 512-byte page size. Accordingly, as the capacity of NAND flush memory devices has increased, efforts have been made to reduce the data transmission time between the NAND flash memory device and the flash controller.

U.S. Patent Publication No. 2006-0023499 entitled "NON-VOLATILE MEMORY DEVICE FOR PERFORMING DDR OPERATION IN DATA OUTPUTTING PROCESS AND DATA OUTPUTTING METHOD OF THE SAME CAPABLE OF OUTPUTTING DATA AT FALLING EDGE AS WELL AS RISING EDGE OF READ CONTROL SIGNAL", which claims priority from Korean Patent No. 10-0546418, describes one such effort at reducing the data transmission time. In particular, the above-referenced documents describe data transmission techniques in which data is transferred in synchronization with both the rising and falling edges of the control signal /RE. Both the above-referenced U.S. patent publication and the Korean patent from which it claims priority are incorporated herein by reference as if set forth in their entireties.

According to the above-referenced documents, data read out through a page buffer circuit of a non-volatile memory device is output externally in synchronization with the rising and falling edges of a clock signal (e.g., S_REB) that oscillates in a half cycle of the signal /RE. Such a data output scheme enables data to be rapidly output from the NAND flash memory device to, for example, a flash controller. However, using the signal /RE to generate a clock signal may cause problems.

In particular, as shown in FIG. 1, in the standard 48-pin TSOP1 chip, the signal /RE is supplied through a control pin that is on one side of the chip and data is input and output through the input/output pins I/O0~I/O7 that are on the other side of the chip. As shown in FIG. 2, the signal /RE that is input to the chip is converted into the clock signal S_REB by a clock generator 10 (the clock generator 10 corresponds to the frequency controller 553 of the forgoing disclosure). The clock signal S_REB is applied to a data buffer circuit 20 that is adjacent to the input/output pins I/O0~I/O7. The data buffer circuit 20 outputs-data in synchronization with the rising and falling edges of the clock signal S_REB. As shown in FIG. 2, the signal /RE is transferred to the data buffer circuit 20, which is on the right side of the chip, from a pin on the left-side of the chip. With this configuration, it may be difficult to maintain a duty ratio of the signal /RE (from which the clock signal S_REB is generated) at a fixed value (e.g., 50%). As a result, setup/hold margins may be different between data output in synchronization with a rising edge of the clock signal S_REB and data output in synchronization with a falling edge of the clock signal S_REB. Thus, it may be difficult to practically implement a NAND flash memory device with a double data rate (DDR) function using the control signal /RE.

SUMMARY

Pursuant to embodiments of the present invention, NAND and other types of flash memory devices that may have improved data transmission speed arc provided, as are memory systems that include such flash memory device. These flash memory devices may also reduced numbers of pins.

Pursuant to some embodiments of the present invention, the flash memory device may include a memory cell array, a clock signal input, an input for receiving a signal designating a writing operating mode and a plurality of data input/output pads. A data input/output buffer circuit is also provided, and may be electrically connected to the clock signal input and to the plurality of data input/output pads. The data input/output buffer circuit may be configured to receive data that is to be written to the memory cell array through the data input/output pads in synchronization with a clock signal that is applied to the clock signal input in response to activation of the signal designating the writing operating mode.

In some embodiments, the input for receiving the signal designating the writing operating mode may be an input for a write-enable signal. In such embodiments, the device may further include an input for a read-enable signal, and the data input/output buffer circuit may also be configured to receive data from the memory cell array and output the data through the input/output pads in synchronization with the clock signal that is applied to the clock signal input in response to activation of the read-enable signal. Moreover, in some of these embodiments, the data input/output buffer circuit may be configured to input and output data in synchronization with both rising and falling edges of the clock signal.

In other embodiments, the input for receiving the signal designating the writing operating mode may be an input for a mode selection signal that indicates one of a reading or writing operating mode. In such embodiments, the data input/output buffer circuit may be further configured to receive data from the memory cell array and output the data through the input/output pads in synchronization with the clock signal that is applied to the clock signal input in response to the mode selection signal designating the reading operating mode. Moreover, in some of these embodiments, the data input/output buffer circuit may be configured to input and output data in synchronization with both rising and falling edges of the clock signal.

In some embodiments, the clock signal input comprises a clock signal input pad, and this clock signal input pad may be disposed between respective ones of the plurality of data input/output pads. Moreover, the device may further include a first row of pins on a first side of the device and a second row of pins on a second side of the device. In these embodiments, a pin connected to the clock signal input pad and a plurality of pins that are connected to respective ones of the plurality of data input/output pads may each be part of the second row of pins, and the pin connected to the clock signal input pad may be disposed between some of the plurality of pins that are connected to respective ones of the plurality of data input/output pads.

In sonic embodiments, the data input/output buffer circuit may receive an address and a command in synchronization with a rising or falling edge of the clock signal. In other embodiments, the data input/output buffer circuit may receives addresses in synchronization with both rising and falling edges of the clock signal. Moreover, the device may also include an input for receiving a data rate selection signal that selects one of single and double data rate modes. In such embodiments, when a data rate selection signal indicates the single data rate mode, the data input/output buffer circuit inputs and outputs data in synchronization with a rising or falling edge of the clock signal, and when the data rate selection signal indicates the double data rate mode, the data input/output buffer circuit inputs and outputs data in synchronization with both rising and falling edges of the clock signal. In still other embodiments, the device may also include a mode-register set circuit that is configured to store a data rate selection command that selects one of single and double data rate modes.

Pursuant to still further embodiments of the present invention, methods of operating a flash memory device that includes a memory cell array and a data input/output buffer circuit that is configured to receive a clock signal at a first input, a signal designating a writing operating mode at a second input, and data that is to be written to the memory cell array at a plurality of data input/output pads arc provided. Pursuant to these methods, data that is to be written to the memory cell array at the plurality of data input/output pads is received in synchronization with the clock signal in response to activation of the signal designating a writing operating mode. In some embodiments of these methods, the signal designating the writing operating mode comprises one of a write-enable signal or a mode selection signal. Moreover, the method may further include receiving data from the memory cell array and outputting the received data through the plurality of data input/output pads in synchronization with the clock signal in response to activation of a signal designating a reading operating mode. The signal designating the reading operating mode may be one of a read-enable signal or a mode selection signal. Additionally, the data may be received in synchronization with both rising and falling edges of the clock signal. The first input may be a first pin that is electrically connected to a clock signal input pad, and this first pin may be disposed between a plurality of pins that are electrically connected to respective ones or the plurality of data input/output pads.

A further understanding of the nature and advantages of the present invention herein may be realized by reference to the remaining portions of the specification and the attached figures.

BRIEF DESCRIPTION OF THE FIGURES

Non-limiting and non-exhaustive embodiments of the present invention will be described with reference to the following figures. In the figures:

FIG. 1 is a diagram illustrating a pin configuration of a standard 48-pin TSOP1 in a general NAND flash memory device;

DETAILED DESCRIPTION

Figure 2:
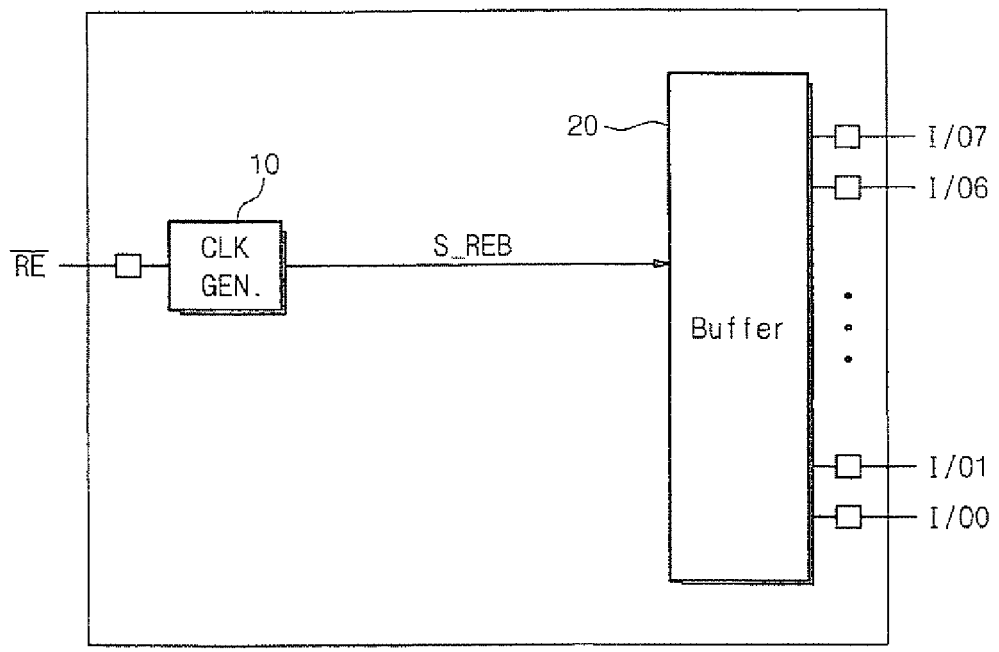
FIG. 2 is a block diagram of the NAND flash memory device shown in FIG. 1.

Certain embodiments of the present invention will be described below, involving a flash memory device as an example in illustrating certain structural and operational features of the invention. The present invention may, however, be embodied in many different forms and should not be constructed as limited to the embodiments set forth herein. Rather, these embodiments are provided so that this disclosure will be thorough and complete, and will fully convey the scope of the present invention to those skilled in the art. Like reference numerals refer to like elements throughout the accompanying figures.

It will be understood that, although the terms first, second, etc. may be used herein to describe various elements, these elements should not be limited by these terms. These terms arc only used to distinguish one element from another. For example, a first element could be termed a second element, and, similarly, a second clement could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (i.e., "between" versus "directly between", "adjacent" versus "directly adjacent", etc.).

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this disclosure and the relevant art and will not be interpreted in an idealized or overly formal sense unless expressly so defined herein.

Figure 3:
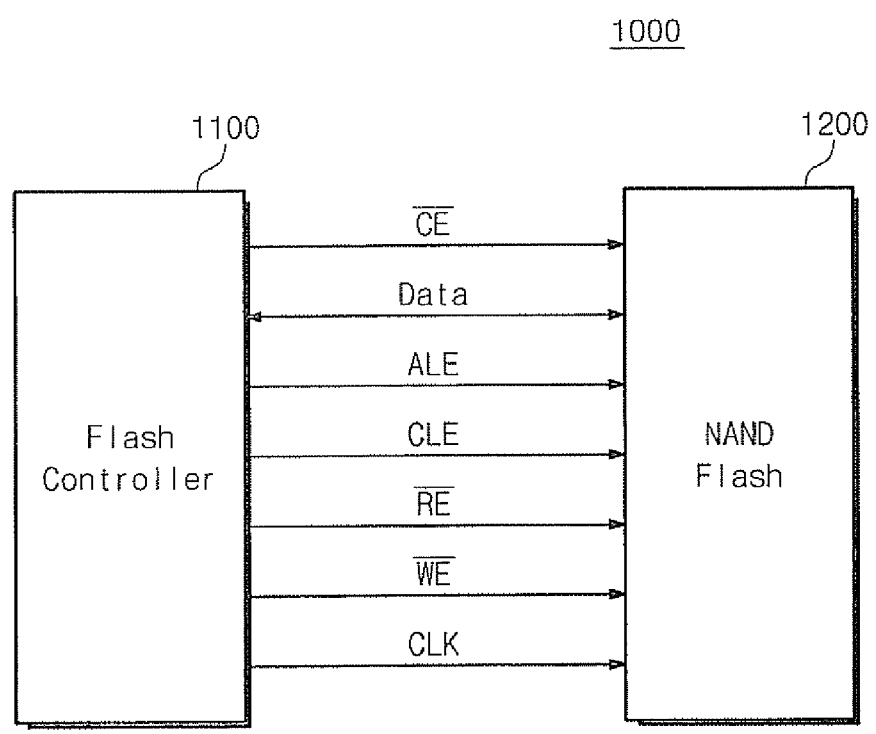
FIG. 3 is a block diagram of a flash memory system according to first embodiments of the present invention.

FIG. 3 is a block diagram of a flash memory system 1000 according to first embodiments of the present invention. As shown in FIG. 3, the flash memory system 1000 may include a flash controller 1100 and a NAND flash memory device 1200. The NAND flash memory device 1200 may be configured to conduct reading/writing operations under the control of the flash controller 1100. The NAND flash memory device 1200 receives addresses, commands, and data in synchronization with transitions of a clock signal CLK instead of a control signal /WE (i.e., write-enable signal) or a control signal /RE (i.e., read-enable signal). In embodiments of the present invention, the signals /WE and /RE may be used as flag signals to indicate operation modes. For instance, the signal /WE is used as a flag signal for a writing mode, while the signal /RE is used as a flash signal for a reading mode. The NAND flash memory device 1200 according to embodiments of the present invention may be configured to receive and output data in synchronization with rising and falling edges of the clock signal CLK. Addresses or commands may also be input to the NAND flash memory device 1200 in synchronization with rising and falling edges of the clock signal CLK. The flash controller 1100 is likewise configured to receive data from the NAND flash memory device 1200 in synchronization with rising and falling edges of the clock signal CLK.

In this embodiment, the NAND flash memory device 1200 may communicate with the flash controller 1100 in accordance with an interface protocol for a standard NAND flash memory device.

Figure 4:
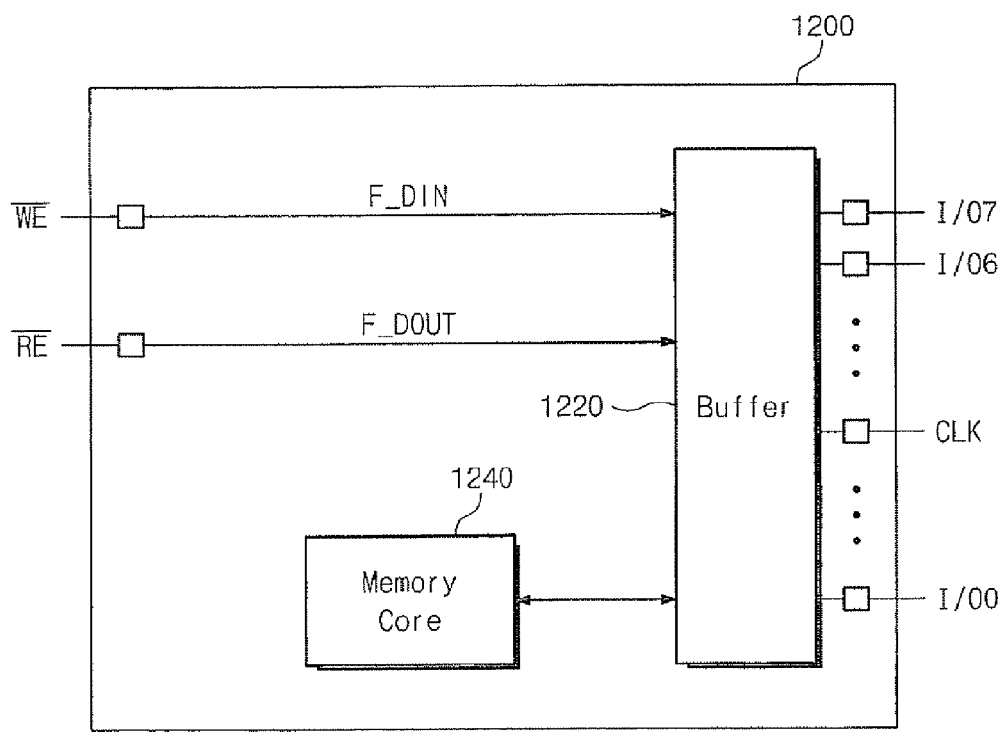
FIG. 4 is a block diagram schematically illustrating the NAND flash memory device shown in FIG. 3.
Figure 5:
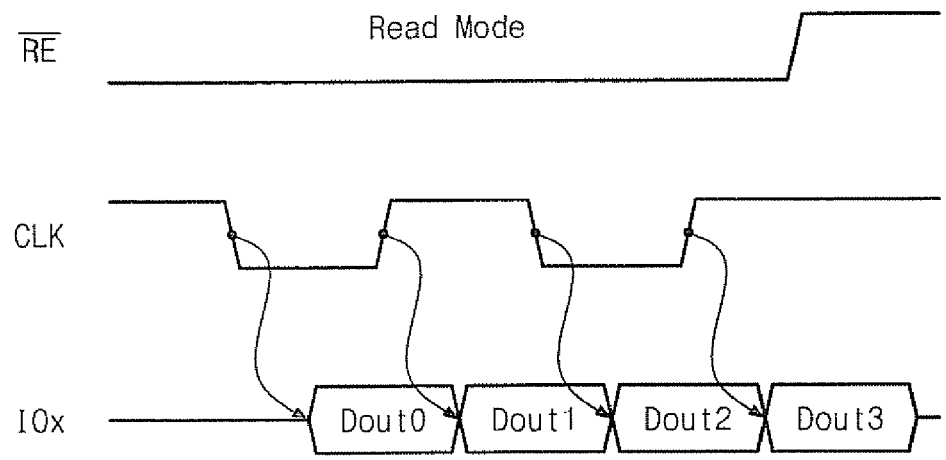
FIGS. 5 and 6 are timing diagrams of reading and writing operations performed by the NAND flash memory device shown in FIG. 4.
Figure 6:
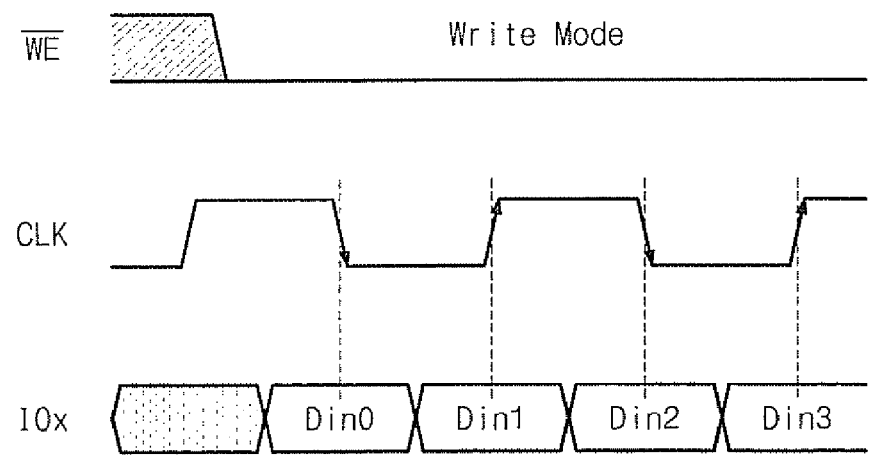

FIG. 4 is a block diagram schematically illustrating structural features of the NAND flash memory device shown in FIG. 3. FIGS. 5 and 6 are timing diagrams illustrating the timing of reading and writing operations performed by the NAND flash memory device 1200 of FIG. 4. Other configurations of the NAND flash memory device 1200 may be arranged in a typical structure as well known by those skilled in this art.

As shown in FIG. 4, the clock signal CLK provided from the flash controller 1100 is applied to an input/output buffer circuit 1220 by way of pad/pin (i.e., a pad and/or pin or other input terminal) that is adjacent to the input/output pads/pins I/O0~I/O7: The pad/pin to which the clock signal CLK is input may, for example, be one of the non-bonded pads/pins (e.g., 25~28, 33~35, 38~40, or 45~48) when a 48-pin TSOP1 is used. The pad/pin supplied with the clock signal CLK may be assigned to a non-bonded pad/pin that is located very close to the input/output pins I/O0~I/O7. As such, the transmission path of the clock signal CLK to the data input/output buffer circuit 1220 is short, and thus the duty ratio of the clock signal CLK applied to the data input/output buffer circuit 1220 can generally be maintained at a predetermined value (e.g., 50%). When this is the case, the setup/hold margins between data output in synchronization with a rising edge of the clock signal CLK and data output in synchronization with a falling edge of the clock signal CLK may be approximately the same. Consequently, a NAND flash memory device with a double data rate (DDR) function may be provided using the clock signal CLK.

Referring still to FIG. 4, the signals /RE and /WE, as flag signals for indicating operation modes, are transferred to the data input/output buffer circuit 1220 by way of their corresponding pads. For example, the signal /RE may be transferred to the data input/output buffer circuit 1220 as the flag signal F_DOUT which indicates the reading operation mode. As shown in FIG. 5, the data input/output buffer circuit 1220 outputs data from memory core 1240 (i.e., a memory cell array of the device) in synchronization with rising and falling edges of the clock signal CLK during the active period of the flag signal F_DOUT. The signal /WE may similarly be transferred to the data input/output buffer circuit 1220 as the flag signal F_DIN for indicating the writing operation mode. As shown in FIG. 6, the data input/output buffer circuit 1220 receives data from an external source in synchronization with rising and falling edges of the clock signal CLK during the active period of the flag signal F_DIN, and outputs the input data to the memory core 1240.

Figure 7:
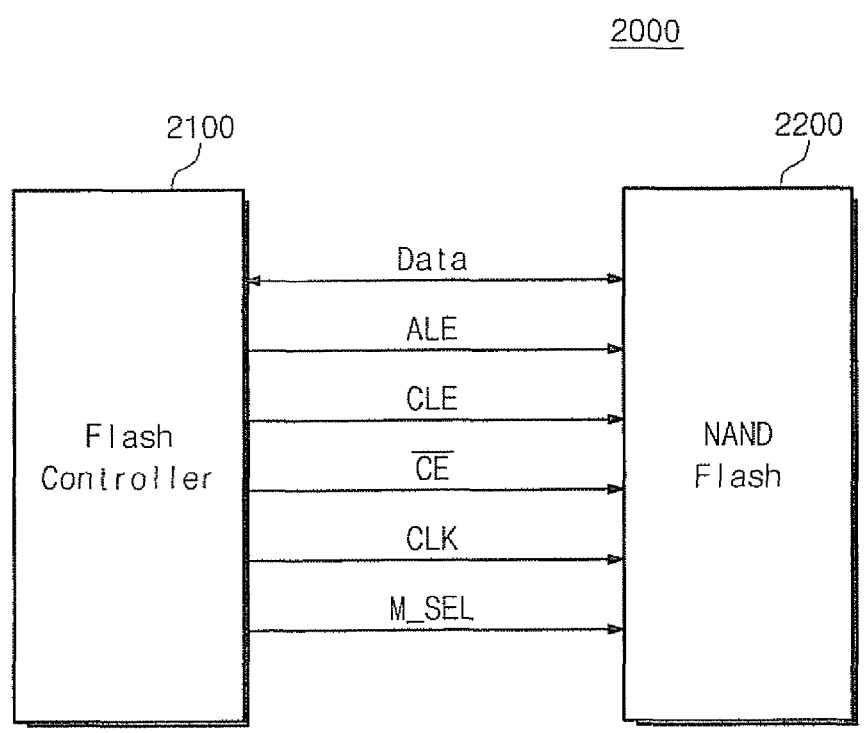
FIG. 7 is a block diagram of a flash memory system according to second embodiments of the present invention.

FIG. 7 is a block diagram of a flash memory system according to second embodiments of the present invention. As shown in FIG. 7, the flash memory system 2000 according to the second embodiments of the present invention includes a flash controller 2100 and a NAND flash memory device 2200. The NAND flash memory device 2200 may be configured to conduct reading/writing operations under the control of the flash controller 2100. The NAND flash memory device 2200 receives addresses, commands, and data in synchronization with transitions of a clock signal CLK, as is the case with respect to the NAND flash memory device 1200 shown in FIG. 3. Thus, the NAND flash memory device 2200 may be configured to receive and output data in synchronization with rising and falling edges of the clock signal CLK. Addresses or commands may also be input to the NAND flash memory device 2200 in synchronization with rising and falling edges of the clock signal CLK. The flash controller 2100 is configured to receive data from the NAND flash memory device 2200 in synchronization with rising and falling edges of the clock signal CLK.

In the NAND flash memory device 2200, a mode selection signal M_SEL may be used as a flag signal for indicating the operation mode instead of the signals /WE and /RE. For instance, the writing operation mode may be enabled when the mode selection signal M_SEL is set to a low level, and the reading operation mode may be enabled when the mode selection signal M_SEL is set to a high level.

In this embodiment, the NAND flash memory device 2200 may communicate with the flash controller 2100 in accordance with an interface protocol for a standard NAND flash memory device.

Figure 8:
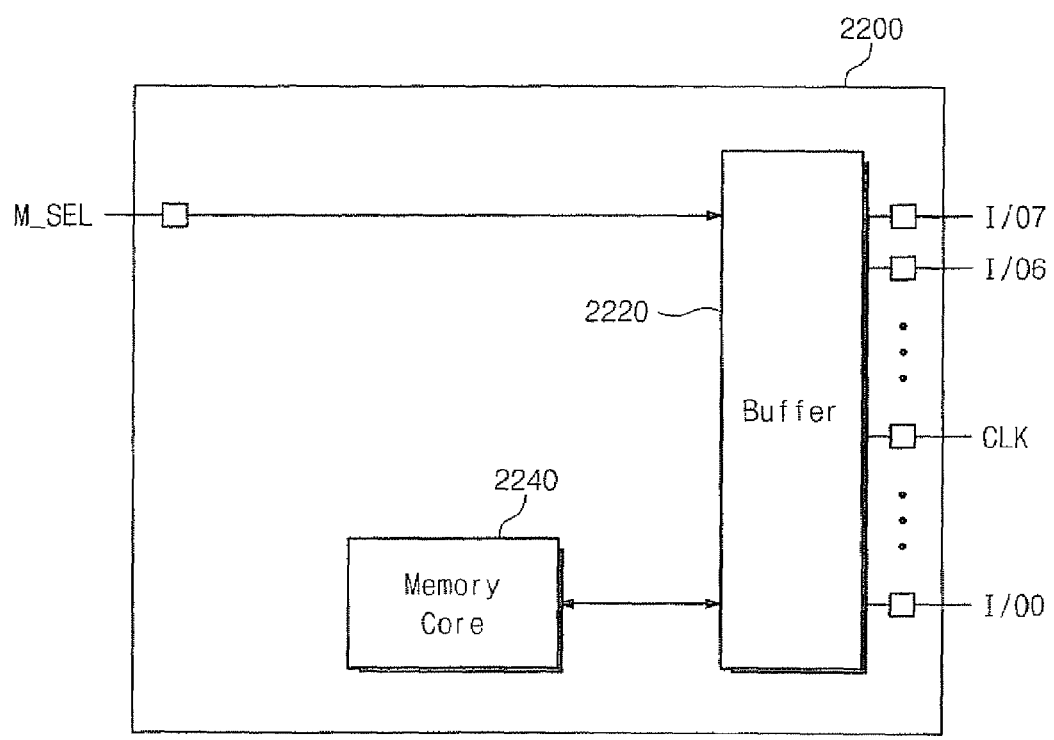
FIG. 8 is a block diagram schematically illustrating the NAND flash memory device shown in FIG. 7.
Figure 9:
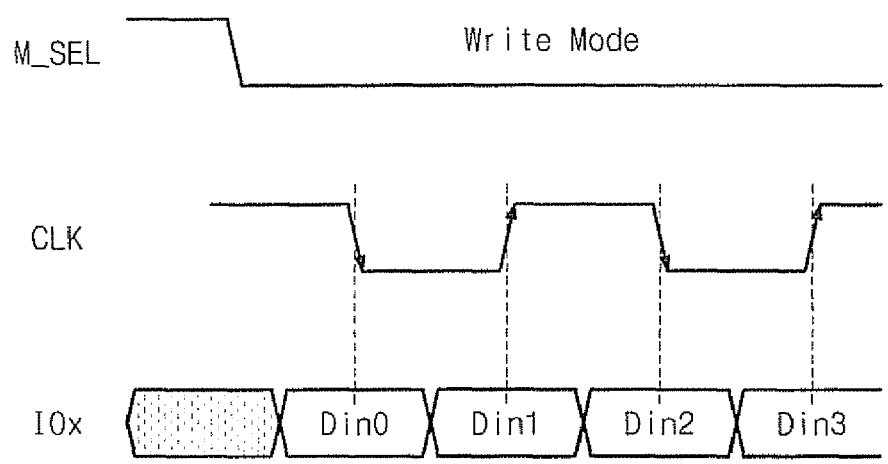
FIGS. 9 and 10 are timing diagrams of reading and writing operations performed by the NAND flash memory device shown in FIG. 8.
Figure 10:
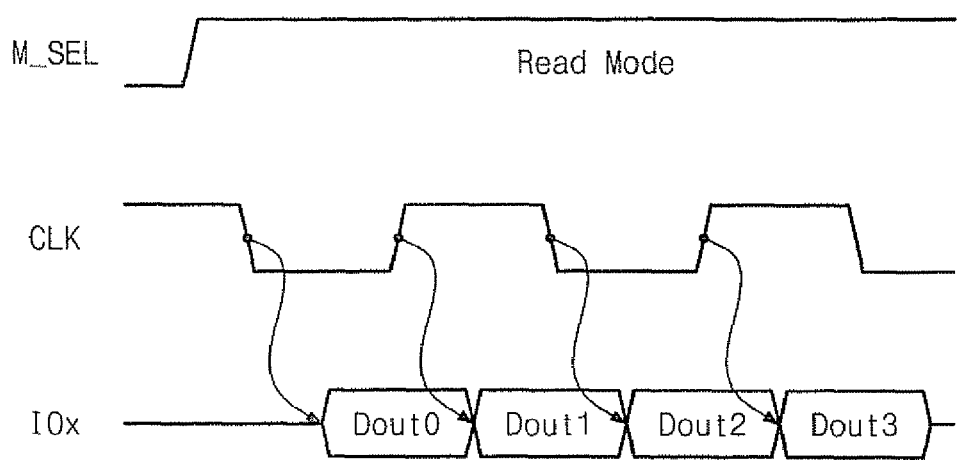

FIG. 8 is a block diagram schematically illustrating structural features of the NAND flash memory device shown in FIG. 7. FIGS. 9 and 10 are timing diagrams illustrating the timing of writing and reading operations by the NAND flash memory device shown in FIG. 8. Other configurations of the NAND flash memory device 2200 may be arranged in a typical structure as well known by those skilled in this art.

As shown in FIG. 8, the clock signal CLK provided from the flash controller 2100 is applied to an input/output buffer circuit 2220 by way of pad/pin that is adjacent to input/output pads/pins I/O0~I/O7. The clock signal CLK may be input to, for example, one of the non-bonded pads/pins (e.g., 25~28, 33~35, 38~40, or 45~48). The pad/pin supplied with the clock signal CLK may be assigned to a non-bonded pad/pin that is located close to the input/output pins I/O0~I/O7. As in the first embodiments of the present invention discussed above, this arrangement of pads/pins facilitates maintaining setup/hold margins on the same level between data output in synchronization with a rising edge of the clock signal CLK and data output in synchronization with a falling edge of the clock signal CLK.

Referring still to FIG. 8, the signal M_SEL, as a flag signal for indicating the operation mode, is transferred to the data input/output buffer circuit 2220 by way of its corresponding pad. For example, if the signal M_SEL that is transferred to the data input/output buffer circuit 2220 has a low level it operates as a flag signal for indicating the writing operation mode, and thus the writing operation begins. Then, the data input/output buffer circuit 2220, as shown in FIG. 9, receives data from an external source in synchronization with rising and falling edges of the clock signal CLK during an active period of the flag signal M_SEL, and outputs the input data to a memory core 2240 (see FIG. 8). On the other hand, if the signal M_SEL that is transferred to the data input/output buffer circuit 2220 has a high level it operates as a flag signal for indicating the reading operation mode, and thus the reading operation begins. Then, the data input/output buffer circuit 2220, as shown in FIG. 10, outputs data from the memory core 2240 in synchronization with rising and falling edges of the clock signal CLK during an active period of the flag signal M_SEL.

Figure 11:
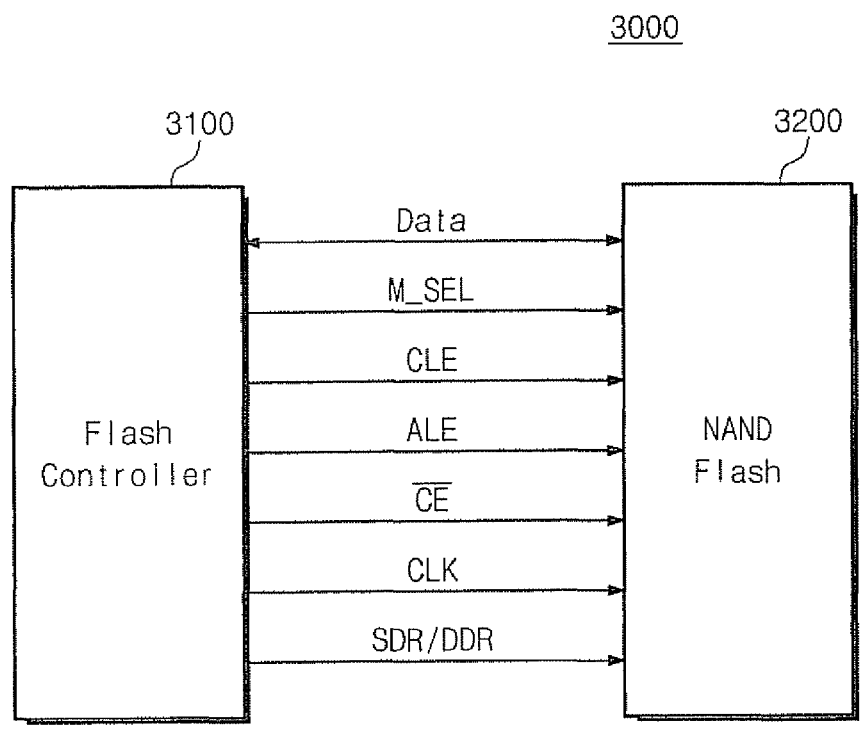
FIG. 11 is a block diagram of a memory system according to third embodiments of the present invention.
Figure 12:
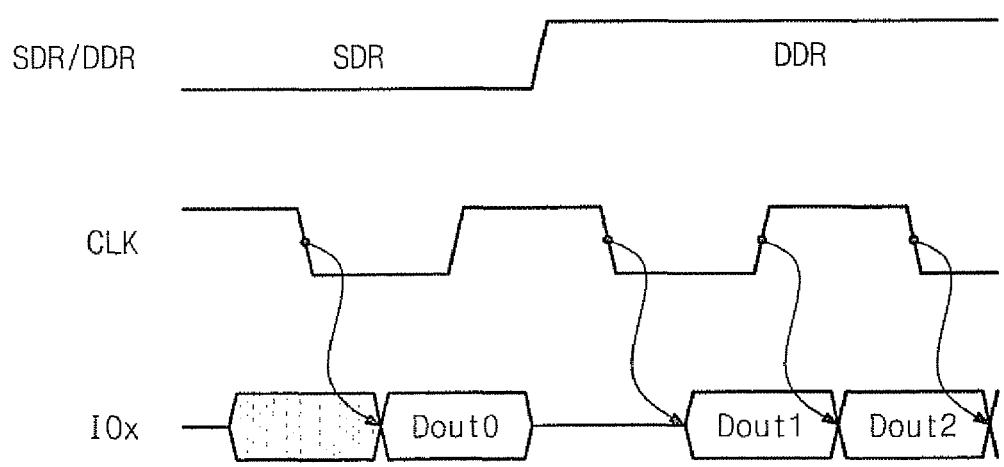
FIG. 12 is a timing diagram illustrating operation of the NAND flash memory device shown in FIG. 11.

FIG. 11 is a block diagram of a memory system according to third embodiments of the present invention, and FIG. 12 is a timing diagram illustrating operation of the NAND flash memory device of FIG. 11.

Referring to FIG. 11, the memory system 3000 according to the third embodiments of the present invention may include a flash controller 3100 and a NAND flash memory device 3200. The NAND flash memory device 3200 is similar to the NAND flash memory device 2200 of FIG. 8, but is operable in a single data rate (SDR) mode in which data is input/output in synchronization with a rising or falling edge of the clock signal CLK, as well as operable in a double data rate (DDR) mode in which data is input/output in synchronization with both rising and falling edges of the clock signal CLK. These modes may be alternatively enabled by the selection signal SDR/DDR. If the selection signal SDR/DDR indicates the SDR mode, as shown in FIG. 12, the NAND flash memory device 3200 receives addresses, commands, and data in synchronization with the rising or falling edges of the clock signal CLK (the rising edge is depicted in FIG. 12). If the selection signal SDR/DDR indicates the DDR mode, as shown in FIG. 12, the NAND flash memory device 3200 receives addresses, commands, and data in synchronization with both the rising and failing edges of the clock signal CLK.

Figure 13:
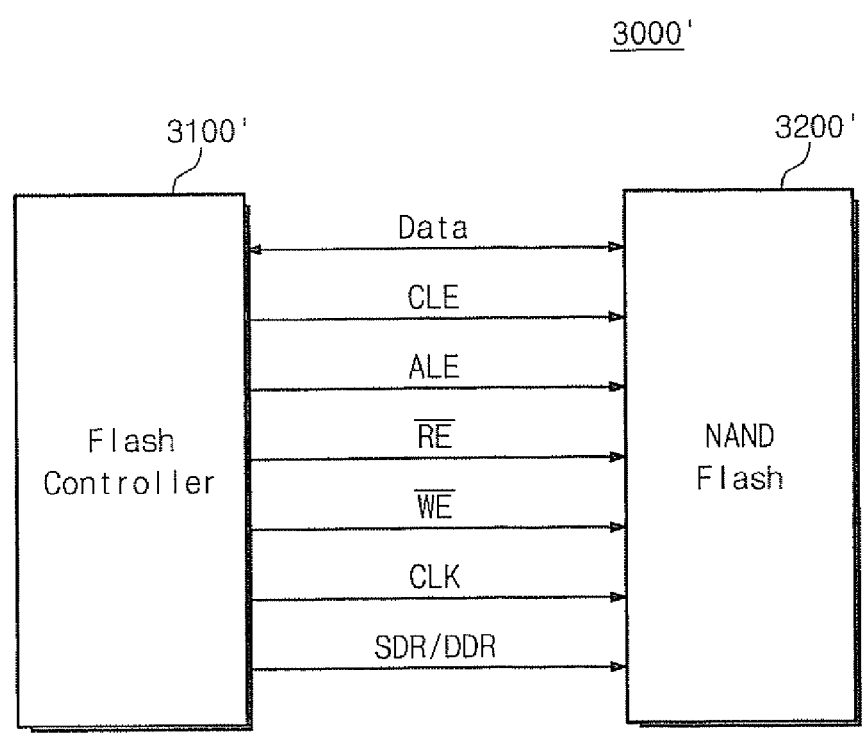
FIG. 13 is a block diagram illustrating another embodiment of the memory system shown in FIG. 11.

An alternative implementation of the memory system 3000 of FIG. 11 is depicted in FIG. 13. As shown in FIG. 13, in this alternative embodiment, the NAND flash memory device is implemented using the signals /RE and /WE (instead of the signal M_SEL) as flag signals for indicating the operation mode.

Figure 14:
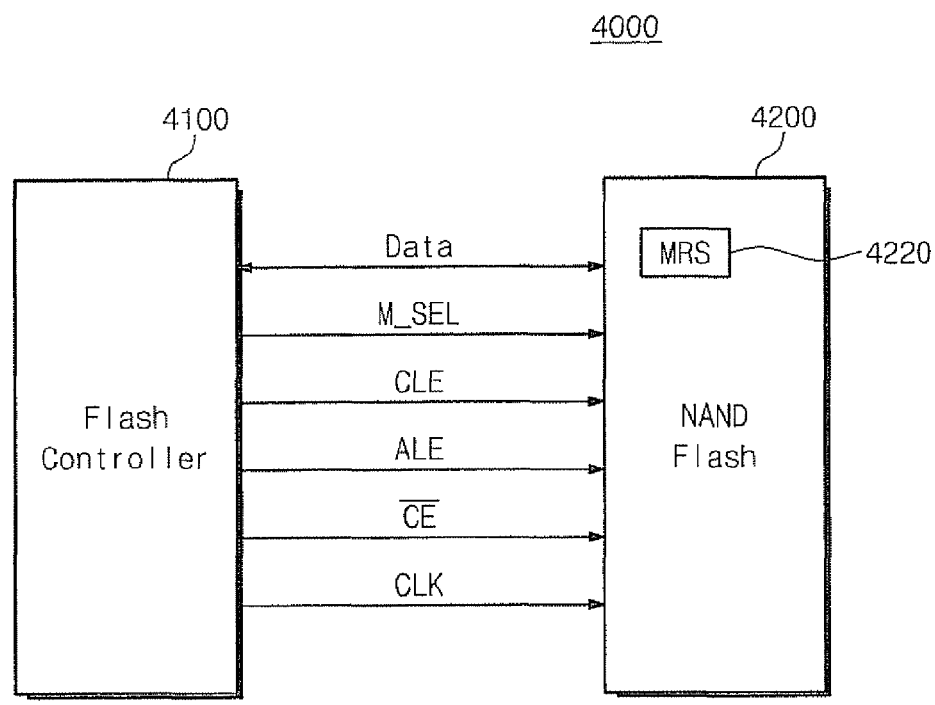
FIG. 14 is a block diagram of a memory system according to fourth embodiments of the present invention.
Figure 15:
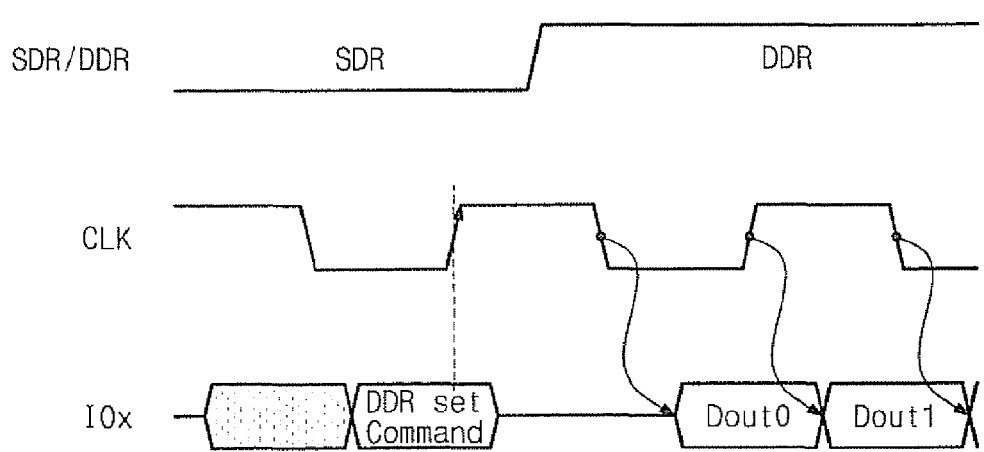
FIG. 15 is a timing diagram illustrating operation of the NAND flash memory device shown in FIGS. 14.

FIG. 14 is a block diagram of a memory system according to fourth embodiments of the present invention, and FIG. 15 is a timing diagram showing operation of the NAND flash memory device of FIG. 14.

Referring FIG. 14, the memory system 4000 according to fourth embodiments of the present invention may include a flash controller 4100 and a NAND flash memory device 4200. The NAND flash memory device 4200 is similar to the NAND flash memory device 2200 of FIG. 8, but is different in that it is operable in either the SDR or DDR mode. The mode selected may be alternatively enabled by setting a mode-register set circuit 4220. In aiming an operation from the SDR mode to the DDR mode, as shown in FIG. 15, the mode-register set circuit 4220 is conditioned with a command in correspondence with the DDR mode. Once the mode-register set circuit 4220 is commanded for the DDR mode, the NAND flash memory device 4200 interfaces with the flash controller 4100 in the DDR mode. For instance, if the mode-register set circuit 4220 is conditioned with a command in correspondence with the DDR mode, as shown in FIG. 15, the NAND flash memory device 4200 receives addresses, commands, and data in synchronization with both rising and falling edges of the clock signal CLK.

Figure 16:
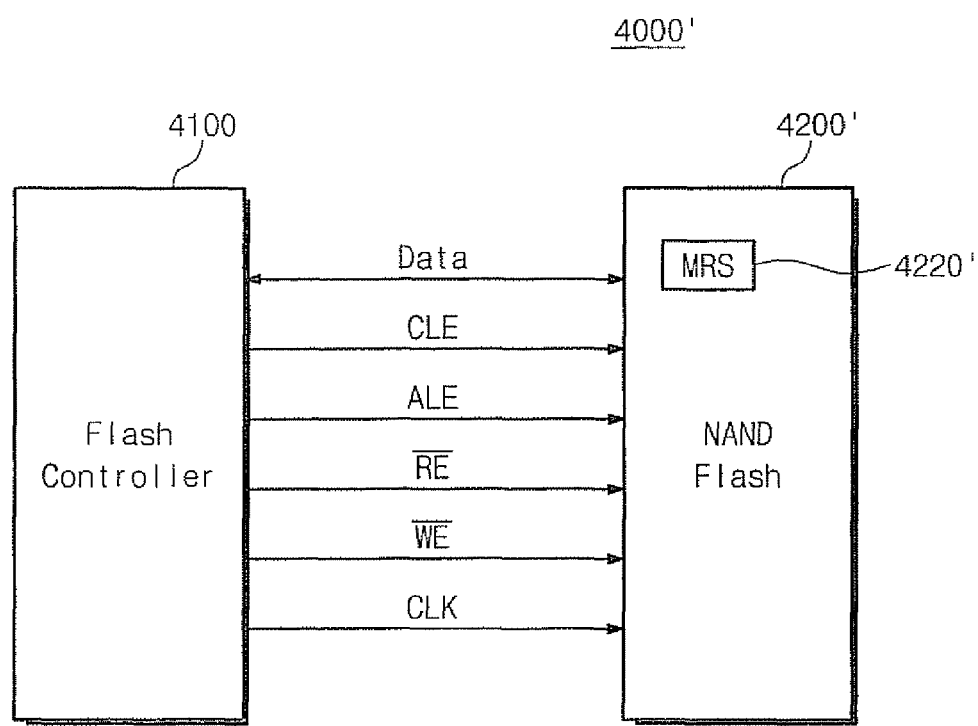
FIG. 16 is a block diagram illustrating another embodiment of the memory system shown in FIG. 14.

An alternative implementation of the NAND flash memory device 4200 of FIG. 14 is depicted in FIG. 16. As shown in FIG. 16, in this alternative embodiment, the NAND flash memory device 4200' is implemented using the signals /RE and /WE (instead of the signal M_SEL) as flag signals for indicating the operation mode.

As described above, pursuant to embodiments of the present invention, NAND flash memory devices having a DDR function may be provided using the clock signal CLK instead of the signals IRE and /WE.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method of operating a nonvolatile memory device with a controller, comprising:

applying a command from the controller to the nonvolatile memory device to set one of a single data rate (SDR) mode and a double data rate (DDR) mode;

applying a first logic level of a flag signal from the controller to the nonvolatile memory device to indicate a data input operation and maintaining the first logic level of the flag signal during the data input operation of nonvolatile memory device;

applying a second logic level of the flag signal from the controller to the nonvolatile memory device to indicate a data output operation and maintaining the second logic level of the flag signal during the data output operation of nonvolatile memory device;
applying a timing signal from the controller to the nonvolatile memory device; and
performing a data communication operation in synchronism with both rising and falling edges of the timing signal between the controller and the nonvolatile memory device when the command sets the DDR mode.

2. The method of claim 1, wherein the flag signal is applied to a pad or a pin of the nonvolatile memory device.

3. The method of claim 2, further comprising:
communicating data, address and command information over a same bus from the controller to the nonvolatile memory device,
wherein the command information includes the command from the controller to the nonvolatile memory device to set one of the single data rate (SDR) mode and the double data rate (DDR) mode.

4. The method of claim 3, wherein the step of applying a command comprises transmitting a command to set a mode register of the nonvolatile memory device.

5. The method of claim 4, wherein the nonvolatile memory device is a NAND flash memory.

6. The method of claim 1, further comprising performing a data communication operation in response to one of rising edges and falling edges of the timing signal between the controller and the nonvolatile memory device when the command sets the SDR mode.

7. A method of operating a flash memory, comprising:
receiving a command to selectively enable one of a single data rate (SDR) mode and a double data rate (DDR) mode;
receiving a flag signal to indicate one of a reading operation and a writing operation;
receiving a timing signal; and
outputting data in response to both rising and falling edges of the timing signal when the command sets a DDR mode and the flag signal indicates the reading operation,
wherein a level of the flag signal is maintained throughout the outputting of data, and
wherein the command, flag signal and timing signal are received from a source external to the flash memory.

8. The method of claim 7, further comprising:
receiving data in response to both rising and falling edges of the timing signal when the command sets the DDR mode and the flag signal indicates the writing operation.

9. The method of claim 8,
wherein the flag signal indicates a writing operation, and
wherein the level of the flag signal indicating the write operation is maintained during the writing operation.

10. The method of claim 7, further comprising:
receiving the timing signal on a first terminal of the flash memory;
receiving the flag signal on a second terminal of the flash memory; and
receiving data, address and commands, including the command to selectively enable one of an single data rate (SDR) and a double data rate (DDR) mode, on a plurality of third terminals of the flash memory;
and wherein the outputting of data is output on the plurality of third terminals.

11. The method of claim 10, wherein the plurality of third terminals and the first terminal are disposed on a first side of the flash memory and the first terminal is disposed between the plurality of third terminals.

12. The method of claim 11, wherein the second terminal is disposed on a second side of the flash memory, the second side being opposite the first side.

13. The method of claim 12, where the plurality of third terminals comprise terminals I/O0 to I/O7, and wherein I/O0 is located below the first terminal and I/O7 is located above the first terminal.

14. The method of claim 7, further comprising:
in response to receiving a command to selectively enable one of the SDR mode and the DDR mode, setting a mode register of the flash memory,
wherein the flash memory is responsive to the mode register to operate in one of the SDR mode and the DDR mode.

15. The method of claim 14, wherein the flash memory is a NAND flash memory.

16. A nonvolatile memory device, comprising:
a nonvolatile memory cell array;
a first terminal configured to receive a timing signal;
a second terminal configured to receive a flag signal indicating a data input operation from an external device in a first state and a data output operation to the external device in a second state;
a plurality of third terminals, each of the third terminals being connected to a data buffer configured to receive data and output data in response to the timing signal; and
a mode register set circuit configured to be selectively set to one of a single data rate (SDR) and a double data rate (DDR) mode, and
wherein when the mode register set circuit is set to the DDR mode and the flag signal indicates the data input operation, the data buffer is configured to receive data via the plurality of third terminals in response to both rising and falling edges of the timing signal, and
wherein the data buffer is configured to receive data while a first logic level of the flag signal is maintained during the data input operation.

17. The nonvolatile memory device of claim 16, wherein the plurality of third terminals and the first terminal are disposed on a first side of the nonvolatile memory device and the first terminal is disposed between the plurality of third terminals.

18. The nonvolatile memory device of claim 17, wherein the second terminal is disposed on a second side of the nonvolatile memory device, the second side being opposite the first side.

19. The nonvolatile memory device of claim 18, where the plurality of third terminals comprise terminals I/O0 to I/O7, and wherein I/O0 is located below the first terminal and I/O7 is located above the first terminal.

20. The nonvolatile memory device of claim 16, further comprising:
wherein the data buffer is configured to transmit data in response to both rising and falling edges of the timing signal when the mode register set circuit sets the DDR mode and the flag signal indicates the data output operation.

21. The nonvolatile memory device of claim 20,
wherein the data buffer is configured to transmit data while a second logic level, different from the first logic level, of the flag signal is maintained during the data output operation.

22. The nonvolatile memory device of claim 16, wherein the data buffer is configured to receive address and command information via the plurality of third terminals.

23. The nonvolatile memory device of claim 22, wherein mode register set circuit configured to be selectively set to one of a single data rate (SDR) and a double data rate (DDR) mode via a mode register set command received via the plurality of third terminals.

24. The nonvolatile memory device of claim 23, wherein the data buffer is configured to receive the mode register set command in response to an edge of the timing signal.

25. The nonvolatile memory device of claim 23, further comprising a NAND flash memory.

26. A memory system, comprising:
   a nonvolatile memory device,
   a memory controller,
   a bus connecting the nonvolatile memory device and the controller, including a flag signal line, a timing signal line, and a plurality of third signal lines,
   wherein the controller is configured issue a command to set one of a single data rate (SDR) mode and a double data rate (DDR) mode, configured to transmit first logic level of a flag signal on the flag signal line to indicate a data input operation and to maintain the first logic level of the flag signal during the data input operation of nonvolatile memory device, configured to transmit a second logic level of the flag signal on the flag signal line to indicate a data output operation and to maintain the second logic level of the flag signal during the data output operation of nonvolatile memory device, configured to transmit a timing signal on the timing signal line from the controller to the nonvolatile memory device, and configured to perform a data communication operation with the plurality of third signal lines in synchronism with both rising and falling edges of the timing signal after issuing the command to selectively set the DDR mode.

27. The memory system of claim 26, wherein the flag signal line is connected to a pad or a pin of the nonvolatile memory device.

28. The memory system of claim 27, wherein the controller is configured to communicate data, address and command information over the third signal lines to the nonvolatile memory device.

29. The memory system of claim 28,
   wherein the nonvolatile array comprises a mode register, and
   wherein the controller is configured to transmit a mode set command to set the mode register of the nonvolatile memory to the SDR mode or the DDR mode,
   wherein the nonvolatile memory is responsive to the setting of mode register to operate in the corresponding SDR mode or the DDR mode.

30. The memory system of claim 29, wherein the controller is configured to transmit the mode set command over the plurality of third signal lines.

31. The memory system of claim 30, wherein the wherein the controller is configured to transmit the mode set command over the plurality of third signal lines in synchronism with an edge of the timing signal.

32. The memory system of claim 29, wherein the nonvolatile memory is a NAND flash memory.

33. The memory system of claim 26, wherein the controller is configured to perform a data communication operation with the plurality of third signal lines in synchronism with only one of rising edges and falling edges of the timing signal after issuing the command to selectively set the SDR mode.

34. The memory system of claim 26,
   wherein the nonvolatile memory comprises:
      a first terminal connected to the timing signal line;
      a second terminal connected to the flag signal line;
      a plurality of third terminals, each of the third terminals being connected to corresponding ones of the plurality of third signal lines;
      a data buffer connected to the timing signal line via the first terminal, connected to the flag signal line via the second terminal, connected to the plurality of third signal lines via the plurality of third terminals, and configured to receive data from the controller and output data to the controller in response to the timing signal received from the controller over the timing signal line; and
      a mode register set circuit configured to be selectively set to the SDR mode or the DDR mode,
   wherein when the mode register set circuit is set to the DDR mode and the flag signal indicates the data input operation, the data buffer is configured to receive data from the controller via the plurality of third terminals in response to both rising edges and falling edges of the timing signal, and
   wherein the controller is configured to maintain a first logic level of the flag signal during the data input operation to allow the data buffer of the nonvolatile memory to input data during the data input operation.

35. The memory system of claim 34, wherein the plurality of third terminals and the first terminal are disposed on a first side of the nonvolatile memory device and the first terminal is disposed between the plurality of third terminals.

36. The memory system of claim 35, wherein the second terminal is disposed on a second side of the memory device, the second side being opposite the first side.

37. The memory system of claim 36, where the plurality of third terminals comprise terminals I/O0 to I/O7, and wherein I/O0 is located below the first terminal and I/O7 is located above the first terminal.

38. The memory system of claim 34, wherein the data buffer is configured to transmit data in response to both rising and falling edges of the timing signal when the mode register set circuit is set to the DDR mode and the flag signal indicates the data output operation.

39. The memory system of claim 38,
   wherein the controller is configured to maintain a second logic level, different from the first logic level, of the flag signal during the data output operation to allow the data buffer of the nonvolatile memory to output data during the data output operation.

40. The memory system of claim 34, wherein the data buffer is configured to receive address and command information via the plurality of third terminals.

41. The memory system of claim 40, wherein mode register set circuit is configured to be selectively set to one of a single data rate (SDR) and a double data rate (DDR) mode via a mode register set command sent by the controller and received via the plurality of third terminals.

42. The memory system of claim 41, wherein the data buffer is configured to receive the mode register set command in response to an edge of the timing signal.

43. The memory system of claim 42, wherein the nonvolatile memory device comprises a NAND flash memory.

* * * * *